United States Patent [19]

England

[11] Patent Number: 4,748,424

[45] Date of Patent: May 31, 1988

[54] MAGNETRON WITH FREQUENCY CONTROL MEANS

[75] Inventor: Melvin G. England, Ashford Common, England

[73] Assignee: Thorn EMI Varian Limited, Hayes, England

[21] Appl. No.: 25,667

[22] Filed: Mar. 13, 1987

[30] Foreign Application Priority Data

Mar. 15, 1986 [GB] United Kingdom ............ 8606459

[51] Int. Cl.$^4$ ............................................. H03B 9/10
[52] U.S. Cl. ........................................ 331/87; 331/88; 315/39.55
[58] Field of Search .................... 331/86, 87, 88; 315/39.51, 39.55

[56] References Cited

U.S. PATENT DOCUMENTS 2,910,652 10/1959 Siedband ............................ 331/88

FOREIGN PATENT DOCUMENTS 0259175 4/1970 U.S.S.R. ............................ 331/88

Primary Examiner—Eugene R. LaRoche
Assistant Examiner—Robert J. Pascal
Attorney, Agent, or Firm—Fleit, Jacobson, Cohn & Price

[57] ABSTRACT

In a magnetron having a rotatable tuning member in the form of a spinner (121), a rotation sensor and an associated processor (10) generates an indication signal (11) representing the instantaneous magnetron frequency. Three level discriminators 13(1), 13(2), 13(3) are arranged to compare the indication signal (11) with respective threshold signals 14(1), 14(2), 14(3) representing different, preset frequencies. The level discriminators produce a trigger signal T effective to initiate transmission of a pulse of radiation whenever the instantaneous magnetron frequency matches one of the preset frequencies.

3 Claims, 5 Drawing Sheets

MAGNETRON WITH FREQUENCY CONTROL MEANS

BACKGROUND OF THE INVENTION

This invention relates to magnetrons and it relates particularly to a magnetron which has a rotatable tuning member, for example a spin tuned magnetron. A spin tuned magnetron generates a microwave output of varying frequency and is useful in radar applications requiring frequency agility.

A known spin tuned magnetron is shown in FIG. 1 of the accompanying drawings.

It comprises an anode 1 in the form of a number (typically, sixteen) of vanes 2 which surround, and project radially inwards, towards a cathode 3. Only two such vanes are illustrated in FIG. 1. A spinner 4 is mounted on bearings 5 for rotation about the longitudinal axis of the cathode and is provided with a number of slots 6 arranged around the axis of rotation. As the slots pass across successive anode cavities, defined between adjacent vanes, the resonant frequency of the anode circuit varies and one complete cycle back and forth across the available tuning range occurs each time a slot moves past a cavity. Thus, in the case of an anode consisting of sixteen evenly spaced vanes and a spinner having eight evenly spaced slots sixteen complete frequency cycles are obtained for each rotation of the spinner. It has been customary to generate an indication of the instantaneous magnetron frequency. This indication can be utilized to assist in tuning the receiver local oscillator to the transmitted frequency.

The indication can be derived from the spinner drive. However, because the drive rotor is coupled to the spinner magnetically, through the vacuum envelope of the magnetron (7, in FIG. 1), it may be subject to a phase lag with respect to the spinner, giving rise to error. An alternative approach involves using a capacitive transducer comprising two sets of meshing plates, one set being mounted on the spinner, inside the envelope, and the other set being fixed in relation to the spinner. The plates are divided into the same number of segments as there are anode cavities and so a variation of capacitance, resulting from rotation of the spinner relates directly to the variation of magnetron frequency. The transducer is relatively bulky and can be susceptible to interference from local fields within the magnetron.

Hall effect devices, responsive to changes of magnetic field caused by rotation of the spinner, have also been used, though again these devices may be susceptible to interference from local fields.

A preferred approach is described in our copending European patent application No. 86 300940.3. Rotation of the spinner is monitored by sensing movement of markings, formed circumferentially at its surface, past a window in the magnetron vacuum envelope. A processing circuit counts pulses generated by a detector as the markings pass the window and evaluates the instantaneous magnetron frequency.

In normal operation, the magnetron transmits pulses of radiation periodically, typically at a p.r.f. of about 5 kHz, whereas the frequency agility rate may be of the order 1200–1600 Hz. In general, transmissions occur at distinctly different phases in successive frequency cycles and so, in effect, pulses are transmitted in accordance with a pseudo-random sequence of frequencies.

In some operational circumstances, particularly if a receiver, associated with the magnetron, is remote from the transmitter, it is desirable to transmit pulses only at preselected frequencies, and it is one aim of the present invention to provide a magnetron whereby this objective may be satisfied.

SUMMARY OF THE INVENTION

Accordingly there is provided a magnetron including a rotatable tuning member, means responsive to rotation of the tuning member to generate an indication signal representative of the instantaneous magnetron frequency, and control means for utilizing said indication signal to generate a trigger signal, effective to initiate transmission of a pulse of radiation, provided the instantaneous magnetron frequency, as represented by the indication signal, satifies a predetermined criterion.

In one embodiment said control means is arranged to generate a said trigger signal provided the instantaneous magnetron frequency has any one of a number of different predetermined values, and this may be accomplished by comparing the indication signal with respective threshold signals related to said predetermined values and generating a trigger signal in dependence on the comparison.

BRIEF DESCRIPTION OF THE DRAWINGS

In order that the invention may be carried readily into effect an embodiment thereof is now described, by way of example only, by reference to the accompanying drawings of which.

DESCRIPTION OF THE PREFERRED EMBODIMENT

Figure 2:
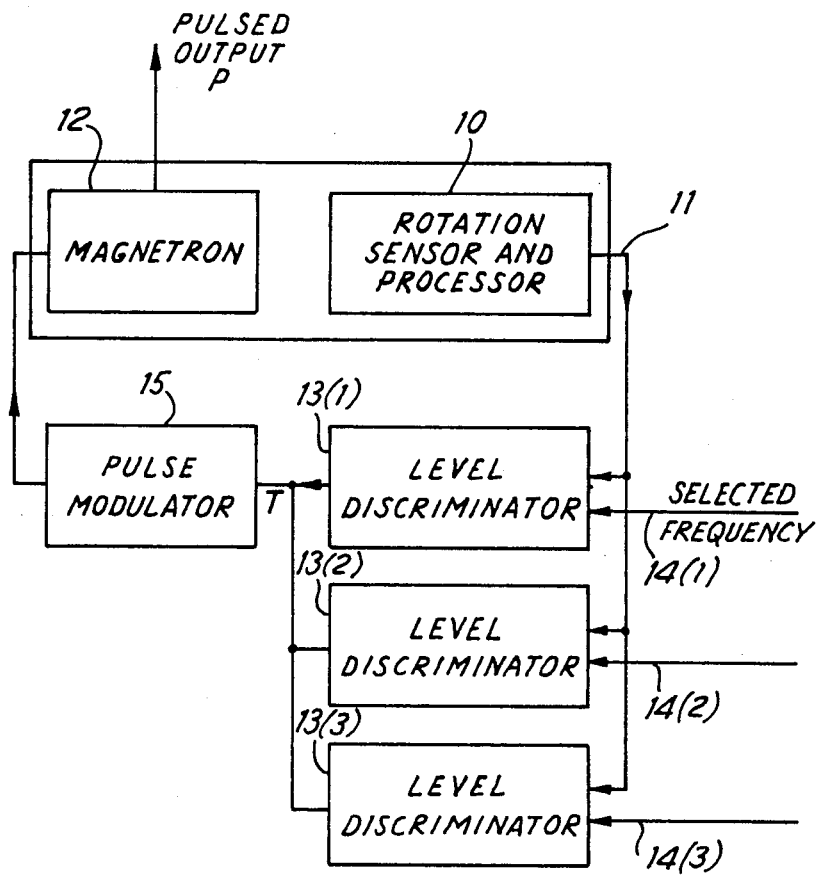
FIG. 2 shows, schematically a magnetron and associated control circuitry in accordance with the present invention.

Referring now to FIG. 2, a rotation sensor and processing circuit, shown generally at 10, generates an indication signal 11 representing the instantaneous magnetron frequency of a coaxial magnetron, shown at 12.

Figure 3:
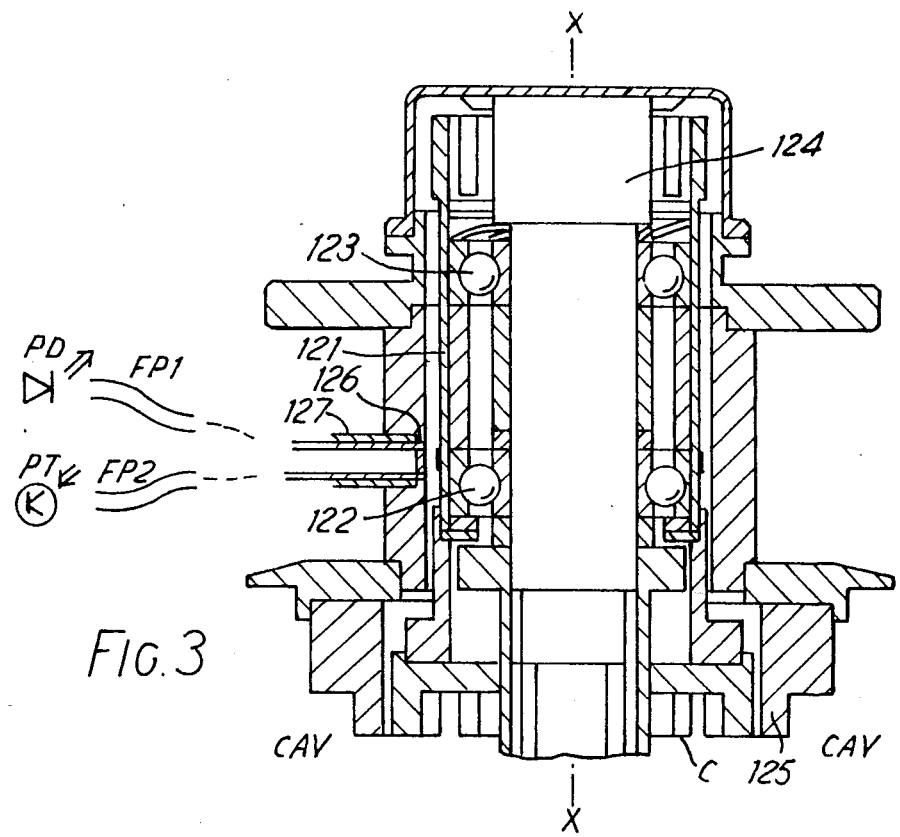
FIG. 3 shows a cross-sectional view through part of a coaxial magnetron represented schematically in FIG. 2.

In this example, coaxial magnetron 12 is of the form described in our copending European atent application No. 86300940.3. Referring to FIG. 3, the coaxial magnetron has a tuning member in the form of a spinner 121 mounted by means of a pair of ball races 122, 123 for rotation about the longitudinal axis XX of the cathode 124. The spinner is coupled magnetically to a drive shaft mounted outside the envelope but not shown in FIG. 3.

In this particular example the magnetron has 32, fixed anode vanes (not shown in the drawing) spaced evenly around the axis of the cathode. The spinner is provided with nine evenly spaced castellations C which are caused to rotate, in use, relative to an outer, fixed shutter 125 which also has nine, evenly spaced castellations located in the coaxial cavity of the magnetron shown generally at CAV. As the spinner rotates and the castellations C on the spinner 121 move past the spaces between castellations on shutter 125 the instantaneous magnetron frequency in the coaxial cavity changes.

The spinner has a number of markings applied circumferentially at an exterior surface and an indication of the instantaneous magnetron frequency is derived by monitoring movement of the markings past a fixed reference position as the spinner rotates. This provides an indication of the angular position of the spinner and so the frequency excursion of the transmitted microwave energy.

Figure 4:
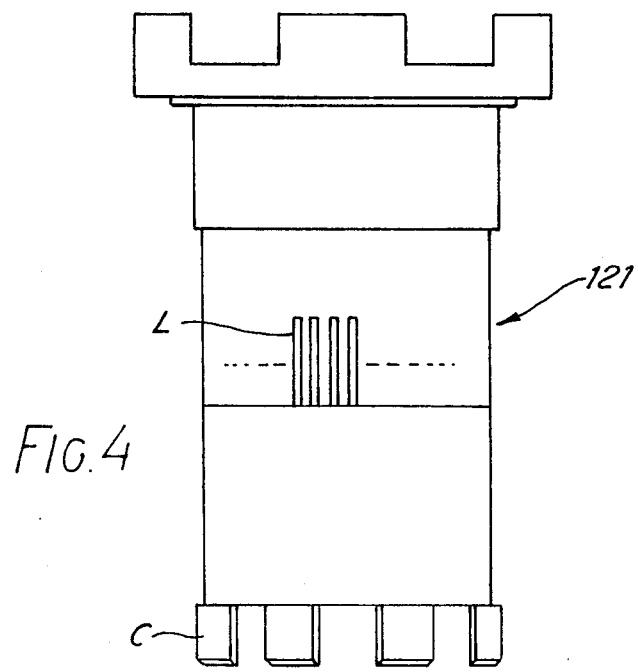
FIG. 4 shows a side view of the spinner used in the magnetron of FIG. 3 and illustrates markings applied at an external surface thereof.

The markings are shown, by way of example, on an exaggerated scale, in the side view of the spinner illustrated in FIG. 4. In this example the markings comprise lines L formed by engraving the surface of the spinner, although alternative arrangements are envisaged; the markings may be painted on the surface of the spinner, for example, and may comprise lines or dots.

In this example, the spinner has, in effect, 72 lines spaced evenly at intervals of 0.5 mm around the circumference of the spinner; that is eight lines for every frequency cycle in the magnetron response. In practice, for reasons which will become apparent hereinafter, the first line in each group of eight, corresponding to the start of each new frequency cycle, is omitted.

In this example the magnetron is provided with a glass window shown at 126 in FIG. 3 and light from a photo diode PD is directed through the window to illuminate the spinner within. Light is transmitted to the window along a fiber optic pipe FP1 and light reflected at the spinner is transmitted along another fiber optic pipe FP2 to a photo sensitive transistor PT which generates an electrical pulse in response to a change in light intensity occasioned by movement of a line past the window. In practice a common fiber optic cable (supplied, for example, by FORT Fibre Optiques of Paris Ref. BFS) is used to transmit light to and away from the spinner, the cable being bonded in a mounting 127 in the vacuum envelope to abut the window 126.

As the spinner rotates the markings are sensed by the photo sensitive transistor PT which generates a succession of square wave pulses. These are applied to an electrical circuit, shown in FIG. 5, for processing to generate indication signal 11 (FIG. 2) representing the instantaneous magnetron frequency.

Figure 5:
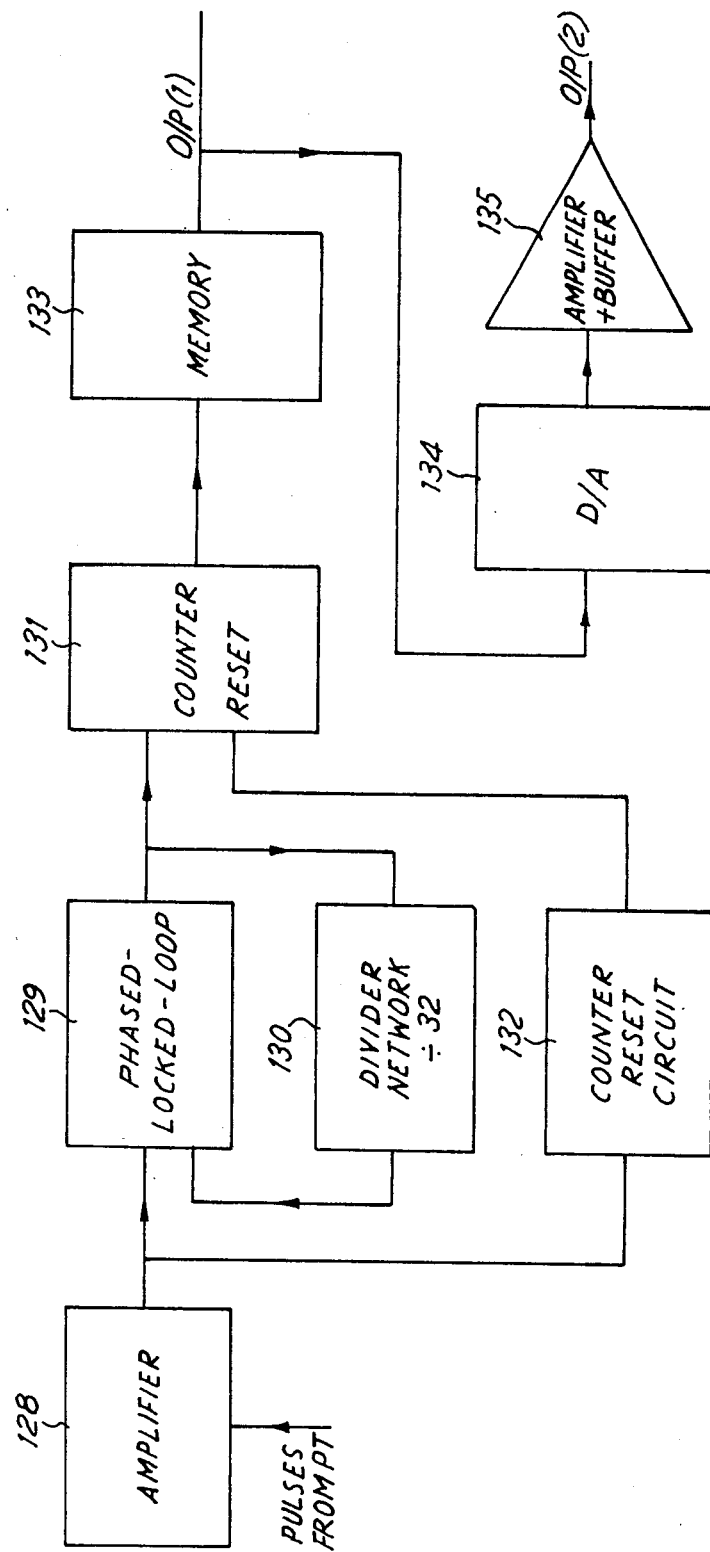
FIG. 5 illustrates, in block schematic form, a circuit used to process pulses generated in response to rotation of the spinner of FIG. 4.

Referring to FIG. 5, pulses generated by transistor PT are received at an amplifier 128 and routed via a phase-locked loop 129 and a divide-by-32 network 130 to a binary counter 131 arranged to count pulses corresponding to each frequency cycle i.e. up to 256 pulses (8×32). At the end of each frequency cycle a counter reset circuit 132 is triggered, counter 131 is reset and the count sequency repeated. Respective predetermined frequency values, corresponding to the 256 pulses of each frequency cycle are stored in a memory 133, and a stored frequency value corresponding to the instantaneous value of the count is selected from memory 133 and routed, in digital form, to an output location O/P1.

Although an output signal, generated in this way, would have the same periodicity as the variation of instantaneous magnetron frequency, it would not provide an indication of the absolute position of the spinner. To achieve this object a synchronization pulse is generated periodically at the start of each new frequency cycle. This pulse is decoded at 132 and used to reset counter 131.

In an alternative embodiment, counter 131 is arranged to count pulses corresponding to each complete rotation of the spinner. The counter reset circuit 132 is then triggered once during each rotation of the spinner and memory 133 is arranged to store a correspondingly larger number of frequency values. Also, a synchronisation pulse is generated periodically at the beginning of each new rotation of the spinner instead of at the beginning of each new frequency cycle.

Figure 6:
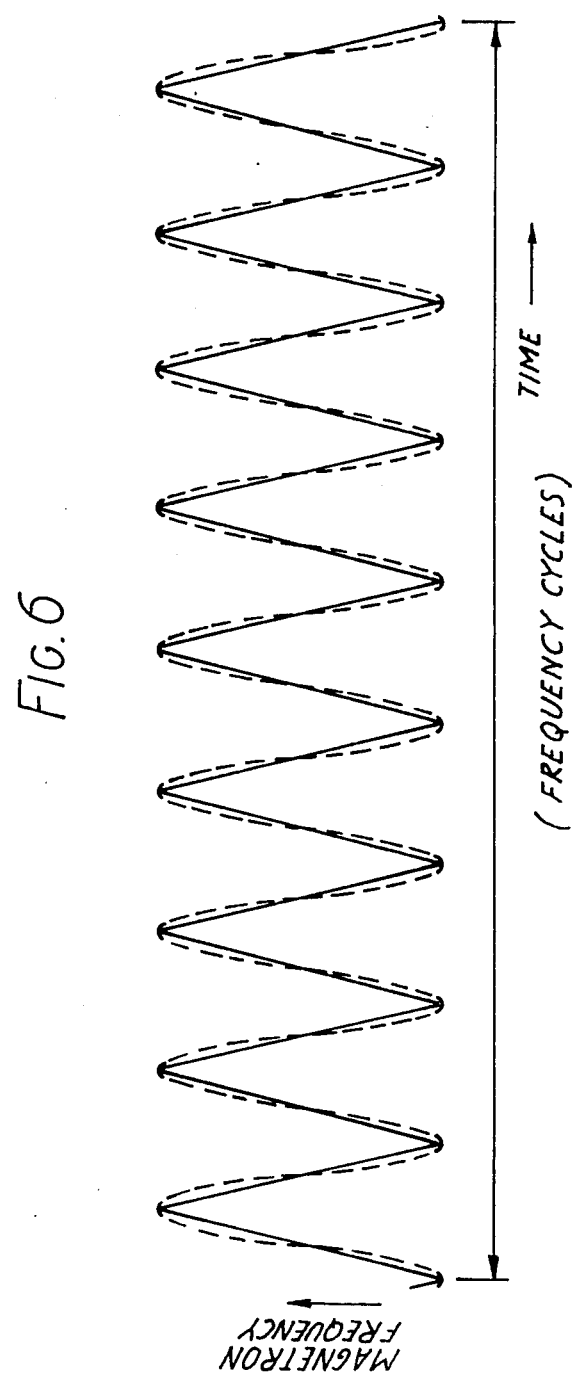
FIG. 6 shows representations of a variation of instantaneous magnetron frequency produced by the circuit of FIG. 5.

FIG. 6 gives two examples of how the indication signal 11 which represents the instantaneous magnetron frequency, and is produced, in digital form, at output location O/P1 of memory 133, varies as a function of time. If desired, the indication signal could be produced in analogue form, at an output location O/P2, by means of a digital-to-analogue conversion circuit 134 and an amplifier 135.

Referring again to FIG. 2, indication signal 11 is compared in three level descriminators 13(1), 13(2), 13(3) with respective threshold signals 14(1), 14(2), 14(3) each representing a different preset frequency. Whenever the instantaneous magnetron frequency matches a preset frequency the respective discriminator generates a trigger signal T causing a pulse modulator 15 to initiate transmission of a pulse P of radiation at that preset frequency. Thus, in the illustrated example, pulses may only be transmitted at three distinctly different, preset frequencies. Clearly, if a different number of discriminators is used transmission could occur at a corresponding number of frequencies.

With the arrangement shown in FIG. 2 a sequence of six pulses will be transmitted in respect of each frequency cycle, this sequence being repeated continuously.

Alternatively, one or more of the level discriminators could be set to generate respective trigger signals provided the instantaneous magnetron frequency matches the respective preset frequency and also exhibits a rising (or alternatively falling) trend. Furthermore, by suitably switching the discriminators into and out of circuit at appropriate times each sequence of transmitted frequencies could be derived from more than one cycle in the variation of instantaneous magnetron frequency.

Figure 1:
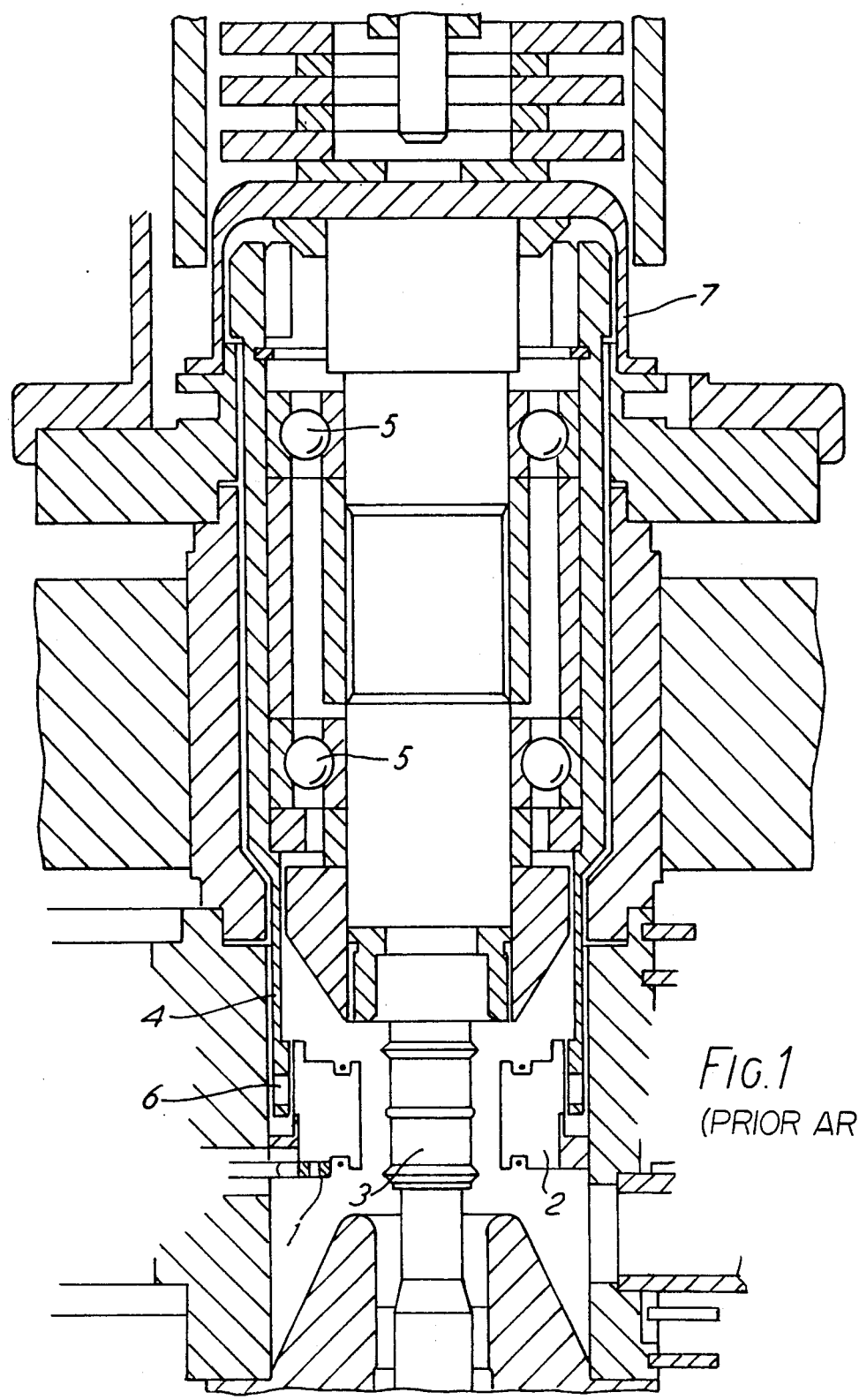
FIG. 1, referred to hereinbefore, shows a cross-sectional view through a known form of spin-tuned magnetron.

It will be understood that the present invention is not restricted to use of a magnetron of the kind described by reference to FIG. 3 of the drawings. Other forms of magnetron, of the kind described by reference to FIG. 1, for example, could be used. Also a different form of rotation sensor could be used eg. a sensor responsive to magnetron drive or a capacitance or Hall effect sensor of the kind described hereinbefore by reference to FIG. 1.

What is claimed is:

1. A magnetron for producing radiation at a continuously varying frequency, the magnetron including a rotatable tuning member, means responsive to rotation of the tuning member for generating an indication signal representing the instantaneous magnetron frequency and control means for generating a trigger signal, effective to initiate transmission of a pulse of radiation produced by the magnetron, whenever the instantaneous magnetron frequency, as represented by the indication signal, has any one of a number of different predetermined values.

2. A magnetron according to claim 1 wherein said control means includes means to compare said indication signal with respective threshold signals, related to said predetermined values, and to generate a said trigger signal in dependence on the comparison.

3. A magnetron according to claim 2 wherein said control means is arranged to compare said indication signal with selected ones of said threshold signals during each successive cycle of the magnetron frequency.

* * * * *